United States Patent
Lee et al.

(10) Patent No.: US 7,132,326 B2
(45) Date of Patent: Nov. 7, 2006

(54) METHOD OF FABRICATING SEMICONDUCTOR DEVICE BY EXPOSING UPPER SIDEWALLS OF CONTACT PLUG TO FORM CHARGE STORAGE ELECTRODE

(75) Inventors: Ho-Ouk Lee, Gyeonggi-do (KR); Se-Min Jung, Gyeonggi-do (KR)

(73) Assignee: Samsung Eelctronics Co., Ltd., Suwon-si (KR)

( * ) Notice: Subject to any disclaimer, the term of this patent is extended or adjusted under 35 U.S.C. 154(b) by 122 days.

(21) Appl. No.: 10/954,871

(22) Filed: Sep. 29, 2004

(65) Prior Publication Data
US 2005/0130367 A1    Jun. 16, 2005

(30) Foreign Application Priority Data
Dec. 15, 2003 (KR) .................. 10-2003-0091570

(51) Int. Cl.
*H01L 21/8242* (2006.01)
(52) U.S. Cl. ...................... 438/253; 438/396
(58) Field of Classification Search ........ 438/253–255, 438/396–399
See application file for complete search history.

(56) References Cited

U.S. PATENT DOCUMENTS 5,597,756 A     1/1997  Fazan et al.
6,168,989 B1    1/2001  Chiang et al.
6,531,372 B1*   3/2003  Lee et al. .................... 438/396
6,569,689 B1*   5/2003  Marsh .......................... 438/3

FOREIGN PATENT DOCUMENTS

KR    1020030057598    7/2003

OTHER PUBLICATIONS

English language abstract of Korean Publication No. 1020030057598.

* cited by examiner

*Primary Examiner*—Richard A. Booth
(74) *Attorney, Agent, or Firm*—Marger Johnson & McCollom, P.C.

(57) ABSTRACT

According to some embodiments, a method includes forming at least two contact plugs that penetrate an insulating layer to connect with a semiconductor substrate. The contact plugs have an upper surface and upper sidewalls that are higher than a top surface of the insulating layer. An etch stop covers the contact plugs and the insulating layer, and a molding layer is formed over the etch stop layer. The molding layer is etched to form a molding pattern having an opening. A bottom of the opening includes a central region that exposes the etch stop on the upper surface and a peripheral region that extends from the central region and the etch stop layer. The etch stop is etched to expose the upper surface. Storage electrodes are formed to contact the contact plugs. The molding pattern is removed to expose the storage electrodes. Other embodiments are described and claimed.

9 Claims, 15 Drawing Sheets

METHOD OF FABRICATING SEMICONDUCTOR DEVICE BY EXPOSING UPPER SIDEWALLS OF CONTACT PLUG TO FORM CHARGE STORAGE ELECTRODE

CROSS-REFERENCE TO RELATED APPLICATIONS

This application claims priority from Korean Patent Application No. 2003-91570, filed on 15 Dec. 2003, the content of which is hereby incorporated by reference in its entirety for all purposes.

BACKGROUND OF THE INVENTION

1. Technical Field

This disclosure relates to the fabrication of semiconductor devices, and more particularly, to methods of fabricating a semiconductor device by exposing the upper sidewalls of a contact plug to form a charge storage electrode.

2. Description of the Related Art

As design rules for semiconductor devices continue to be reduced, a capacitor formation process becomes increasingly important to achieving high integration densities. For this reason, constant efforts have been made to fabricate a capacitor that provides a desired capacitance within a steadily smaller area.

The capacitance of a capacitor is determined by the area of a capacitor and the permittivity of a dielectric layer. The area of the capacitor means an effective area of a dielectric layer between a storage electrode and a plate electrode. The capacitance of the capacitor is proportional to the effective area of the dielectric layer. Furthermore, high-k dielectric layers such as $Ta_2O_5$, $Al_2O_3$, BST (($Ba, Sr$)$TiO_3$) have been used to replace conventional nitride-oxide (NO) dielectric layers, which further increases the capacitance of the capacitor. However, such a high-k dielectric layer must be accompanied by a metal electrode, and the use of a metal electrode also poses many difficulties.

Therefore, research is underway to develop a method of increasing an effective area of a dielectric layer through a structural modification of a charge storage electrode.

A three-dimensionally structured electrode has been disclosed in U.S. Pat. No. 5,597,756 to Fazan et al. ("Fazan") entitled "PROCESS FOR FABRICATING A CUP-SHAPED DRAM CAPACITOR USING A MULTI-LAYER PARTLY-SACRIFICIAL STACK."

FIGS. 1A and 1B are cross-sectional diagrams illustrating a conventional method of fabricating a semiconductor device having a three-dimensional electrode.

Referring to FIG. 1A, an interlayer insulating layer 16 is formed to cover a semiconductor substrate 10 on which a lower structure including capacitor contact plugs 15 is formed, and an etch stop pattern 17 and a molding pattern 18 are formed on the interlayer insulating layer 16, so as to expose the capacitor contact plug 15 and the portion of the interlayer insulating layer 16 around the capacitor contact plug 15. The etch stop pattern 17 is formed to prevent the interlayer insulating layer 16 from being damaged during an etch process for removing the molding pattern 18.

The lower structure includes landing plugs 14, gate electrodes 11, and mask insulating layers 12. The capacitor contact plugs 15 are connected with the semiconductor substrate 10 through the landing plugs 14. The landing plugs 14 are connected to the semiconductor substrate 10, which is exposed between spacer insulating layers 13 covering the sidewalls of the gate electrode 11 and the mask insulating layer 12.

The interlayer insulating layer 16 is formed of a material having good flow characteristics for planarization, and covers the semiconductor substrate 10 having the lower structure described above. Since the interlayer insulating layer 16 has good flow characteristics, it will normally also have a relatively high wet etch rate. For example, the etch rate of the material of the interlayer insulating layer 16 is higher than the etch rate of the material of the molding pattern 18. Thus, in a cleaning process performed after the formation of the molding pattern 18, the interlayer insulating layer 16 exposed around the capacitor contact plug 15 is wet-etched relatively more rapidly, so as to generate a undercut U under the etch stop pattern 17. When the undercuts U are overly formed inside the interlayer insulating layer 16 between the adjacent capacitor contact plugs 15, adjacent charge storage electrodes may be connected.

As shown in FIG. 1B, cylindrical-shaped charge storage electrodes 19 are achieved by forming a conductive layer pattern covering the inner walls of the molding pattern 18 and the capacitor contact plug 15, and removing the molding pattern 18. As described above, in the case that the undercut U is formed, the inner walls of the undercut U are covered with a conductive layer during a deposition process of the conductive layer to form the charge storage electrodes 19. Thus, the adjacent charge storage electrodes 19 are connected as shown in the circled portion A of FIG. 1B, thereby deteriorating the reliability of devices.

Embodiments of the invention address these and other disadvantages of the conventional art.

SUMMARY OF THE INVENTION

Therefore, the present invention is directed to provide methods of fabricating a semiconductor device by exposing the upper sidewalls of a contact plug to form a charge storage electrode.

BRIEF DESCRIPTION OF THE DRAWINGS

The above and other features and advantages of the invention will become more apparent to those of ordinary skill in the art by describing in detail preferred embodiments thereof with reference to the attached drawings that are briefly described below.

FIGS. 2A to 2I are cross-sectional diagrams illustrating a method of fabricating a semiconductor device according to some embodiments of the invention.

DETAILED DESCRIPTION OF THE INVENTION

Figure 1A:
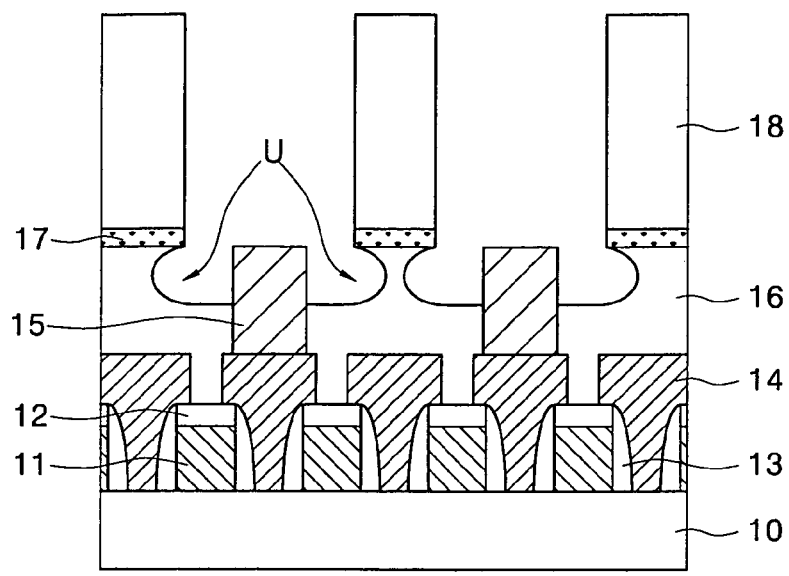
FIGS. 1A and 1B are cross-sectional diagrams illustrating a conventional method of fabricating a semiconductor device.
Figure 1B:
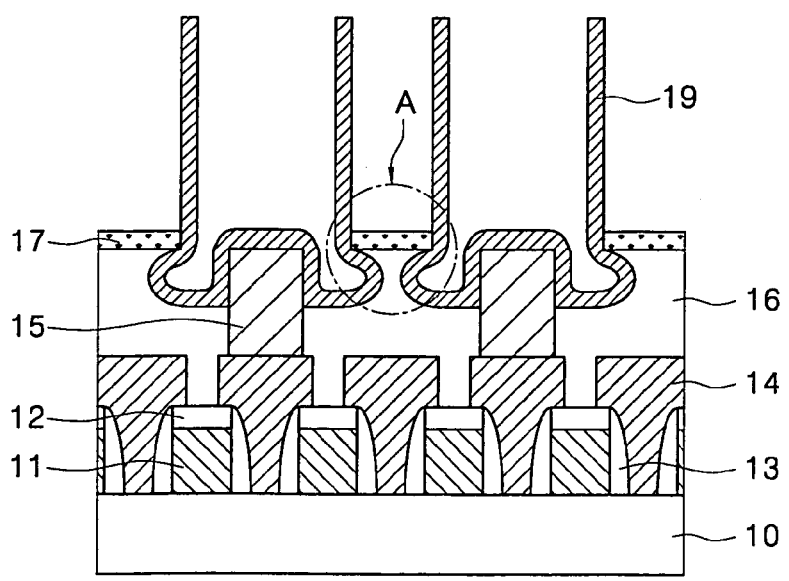

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIGS. 2A to 2I are cross-sectional diagrams illustrating a method of fabricating a semiconductor device according to some embodiments of the invention.

Figure 2A:
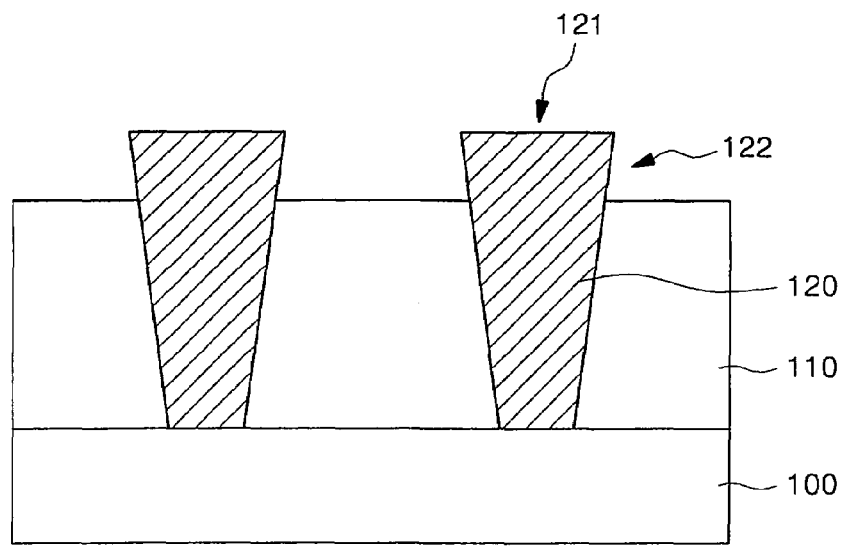

Referring to FIG. 2A, an interlayer insulating layer 110 is formed to cover a semiconductor substrate 100. The interlayer insulating layer 110 may be formed of borophosphosilicate glass (BPSG), phosphosilicate glass (PSG), or undoped silicate glass (USG) having good planarizing characteristics. Then, at least two contact plugs 120 are formed in the interlayer insulating layer 110 to connect with the semiconductor substrate 100, where an upper surface 121 of the contact plugs 120 is higher than the top of the interlayer insulating layer 110, and upper sidewalls 122 of the contact plugs 120 are also higher than the top of the interlayer insulating layer 110. That is, the upper surface 121 and the upper sidewalls 122 of the contact plugs 120 are exposed above the top of the interlayer insulating layer 110, and are not covered by the interlayer insulating layer 110.

The contact plugs 120 may be formed by the following process. Firstly, the contact plugs 120 are formed in the interlayer insulating layer 110 by performing a damascene process, and the interlayer insulating layer is selectively removed to expose the upper surface 121 and the upper sidewalls 122 of the contact plugs. Secondly, the interlayer insulating layer 110 is selectively etched to form a contact hole that exposes the semiconductor substrate, and a conductive layer is deposited on the interlayer insulating layer 110 having the contact hole and patterned to form contact plugs 120, where the upper surface and upper sidewalls of the contact plugs are not covered with the interlayer insulating layer.

Figure 2B:
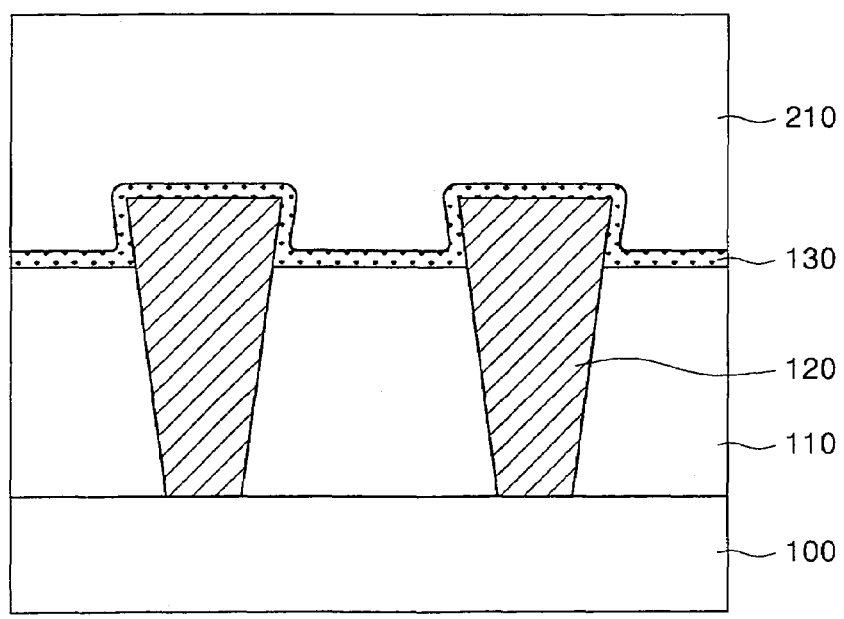

Referring to FIG. 2B, an etch stop layer 130 is formed to cover the contact plugs 120 and the interlayer insulating layer 110 between the contact plugs 120. Then, a molding layer 210 is formed on the etch stop layer 130. The etch stop layer 130 is preferably formed of an insulating layer. The etch stop layer 130 may be formed of SiN. The molding layer 210 is preferably formed of a material having an etch selectivity with respect to the etch stop layer 130. The molding layer 210 may be formed of an oxide layer through a Plasma Enhanced Chemical Vapor Deposition (PECVD) method.

Figure 2C:
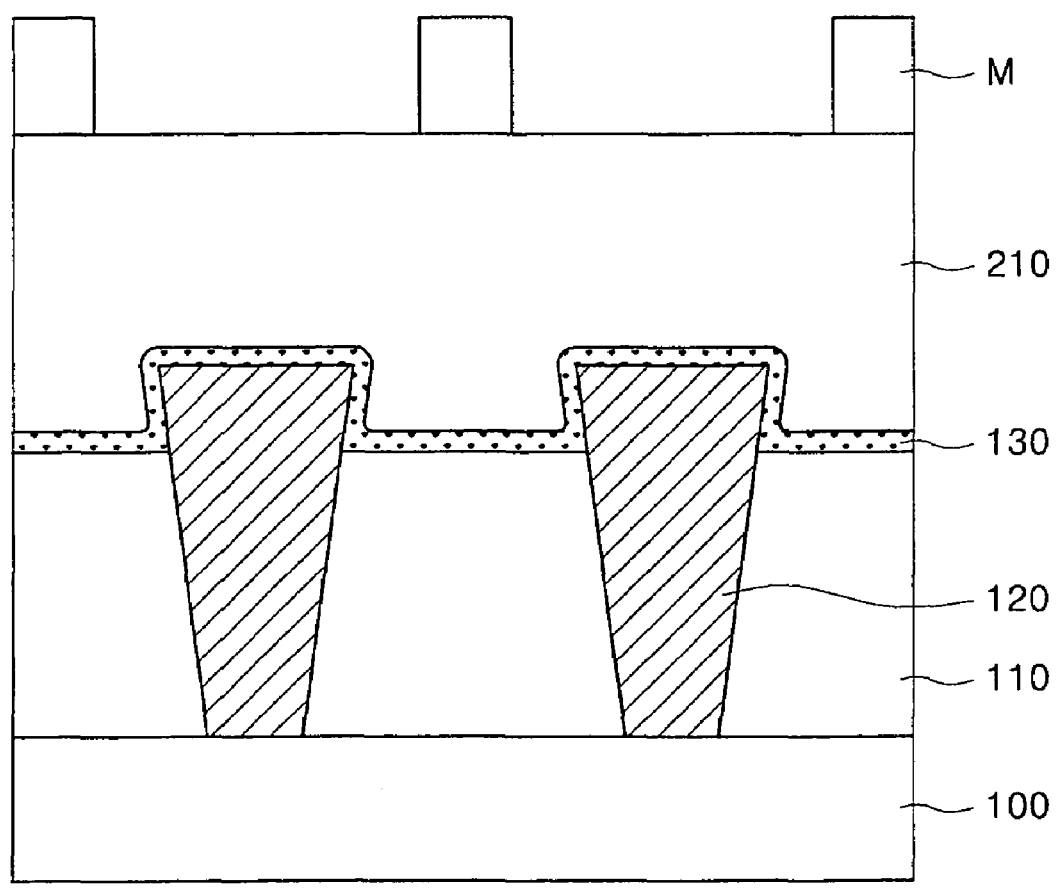

Referring to FIG. 2C, a mask pattern M is formed on the molding layer 210, to define regions for forming charge storage electrodes.

Figure 2D:
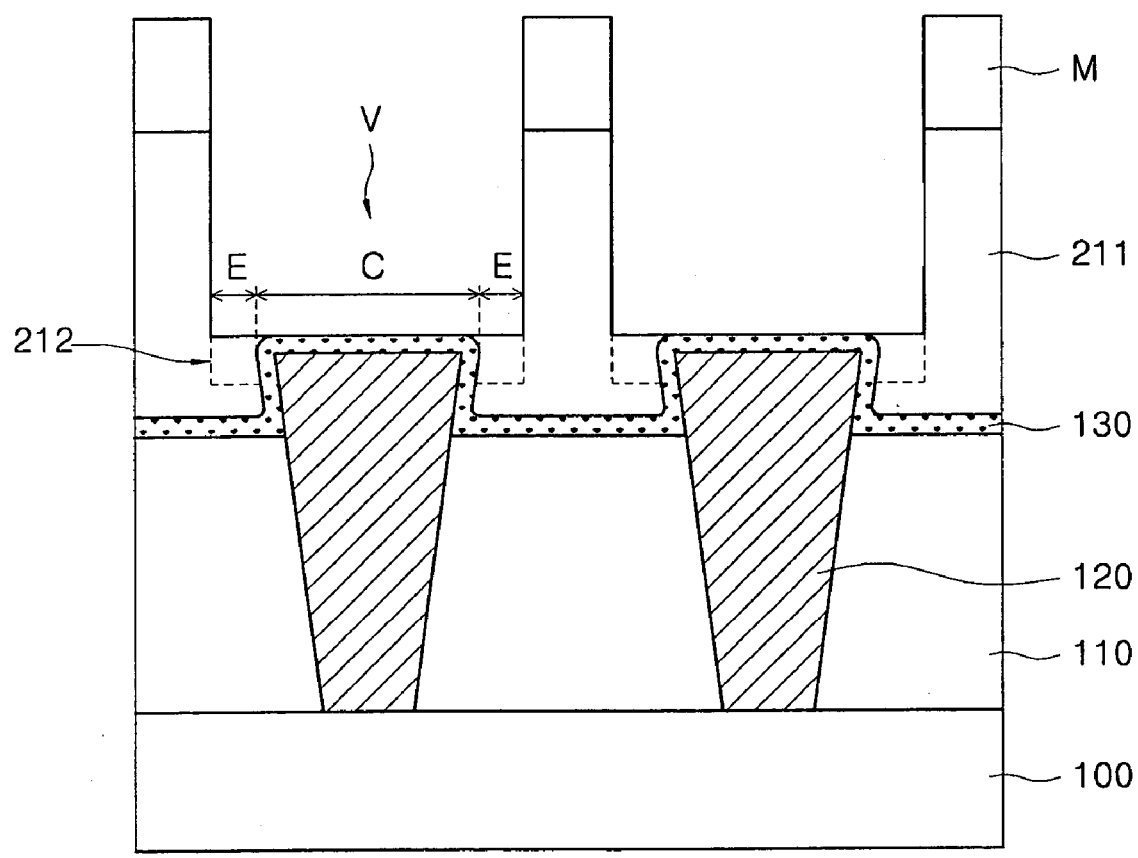

Referring to FIG. 2D, a portion of the molding layer 210, which is exposed after the mask pattern M is formed, is selectively etched, so as to form a molding pattern 211 having an opening V. The bottom of the opening V includes a central region C exposing the etch stop layer 130 on the upper surface of the contact plugs 120, and a peripheral region E horizontally extended from the central region C and spaced apart from the etch stop layer 130 on the interlayer insulating layer 110. By etching the molding layer 210 to a depth where a portion of the etch stop layer 130 on the sidewalls of the contact plugs 120 is exposed, a depth of the opening V may be increased. The dashed line indicated by reference numeral '212' of FIG. 2d represents an extended surface of the molding pattern 211 when the depth of the opening V is increased.

Figure 2E:
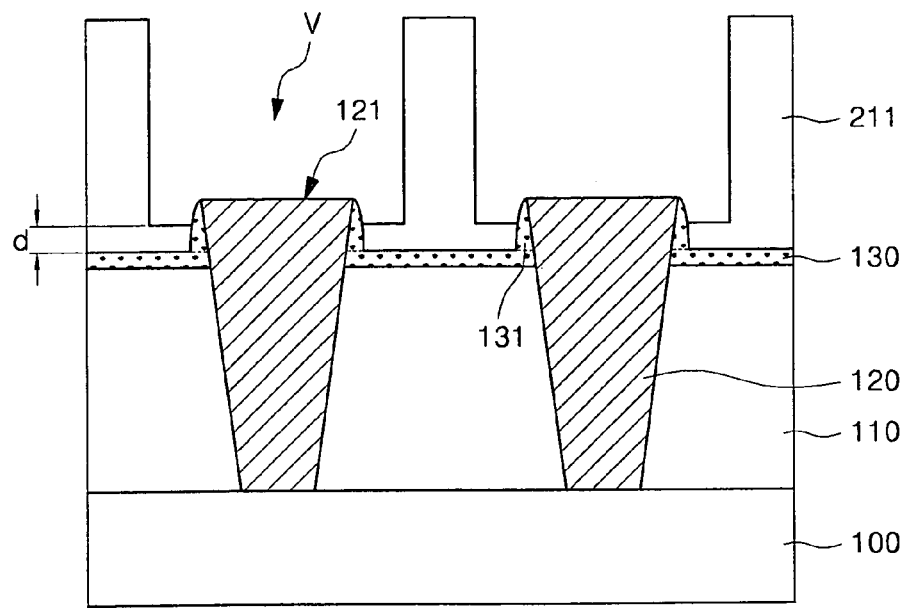

Referring to FIG. 2E, the etch stop layer 130 exposed on the bottom of the opening V is removed so as to expose the upper surface 121 of the contact plugs 120. The etch stop layer 130 may be removed using a dry etch process. However, some of the etch stop layer 130 is left on the upper sidewalls of the contact plugs 120, so as to form spacers 131.

Additionally, after the upper surface 121 of the contact plugs is exposed, a portion of the molding pattern 211 on the bottom of the opening V may be etched by an over-etch process, so as to expose a portion of the spacers 131. The molding pattern 211 that remains on the etch stop layer 130 after the over-etch has a thickness d. The thickness d determines a space dimension between a charge storage electrode to be formed later and the etch stop layer 130.

Next, a cleaning process is performed. The cleaning process may be performed using an etching agent containing HF. During the cleaning process, the interlayer insulating layer 110 between the two adjacent contact plugs 120 is covered by the etch stop layer 130. Thus, unlike the conventional technology, the generation of undercuts inside the interlayer insulating layer 110 due to the cleaning process may be prevented.

Figure 2F:
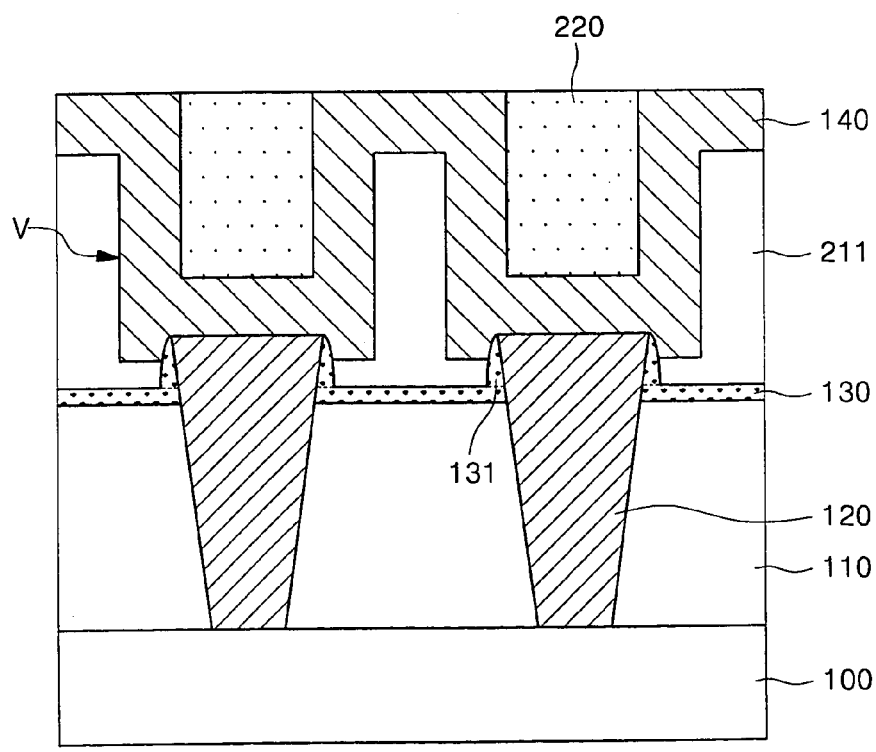

Referring to FIG. 2F, a conductive layer 140 is formed on the semiconductor substrate 100 having the openings V in which the upper surface of the contact plugs 120 is exposed. The conductive layer 140 may be formed of a polysilicon layer. Then, a sacrificial layer 220 is formed to cover the conductive layer 140 inside the opening V. The sacrificial layer 220 may be formed of a BPSG layer or photoresist.

Figure 2G:
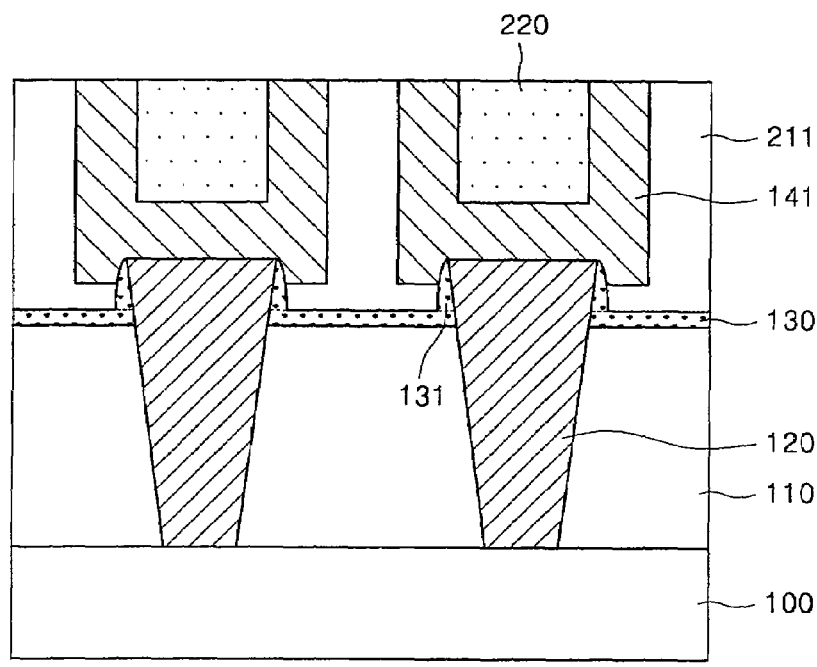

Referring to FIG. 2G, the conductive layer 140 is removed until the surface of the molding pattern 211 is exposed, thereby forming a number of charge storage electrodes 141 that are separated from one another.

Figure 2H:
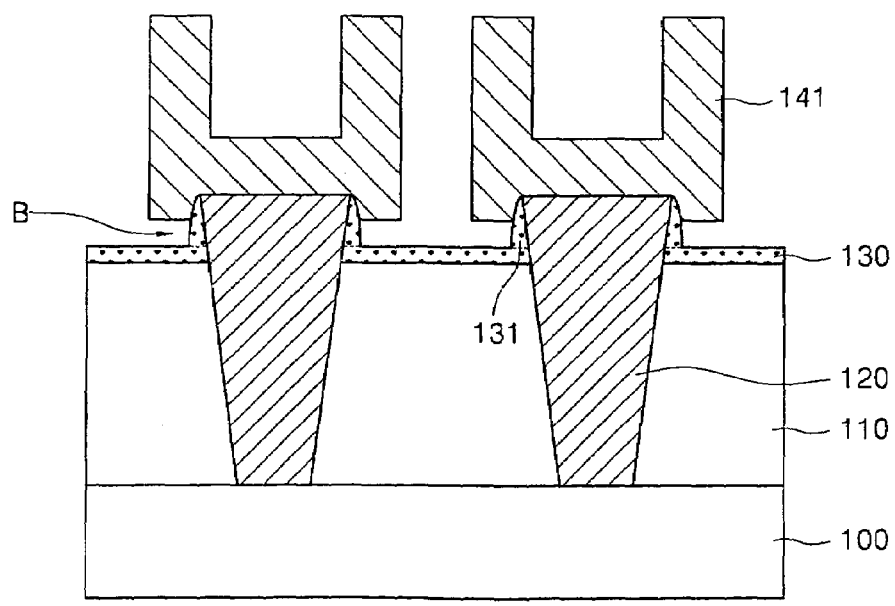
Figure 21:
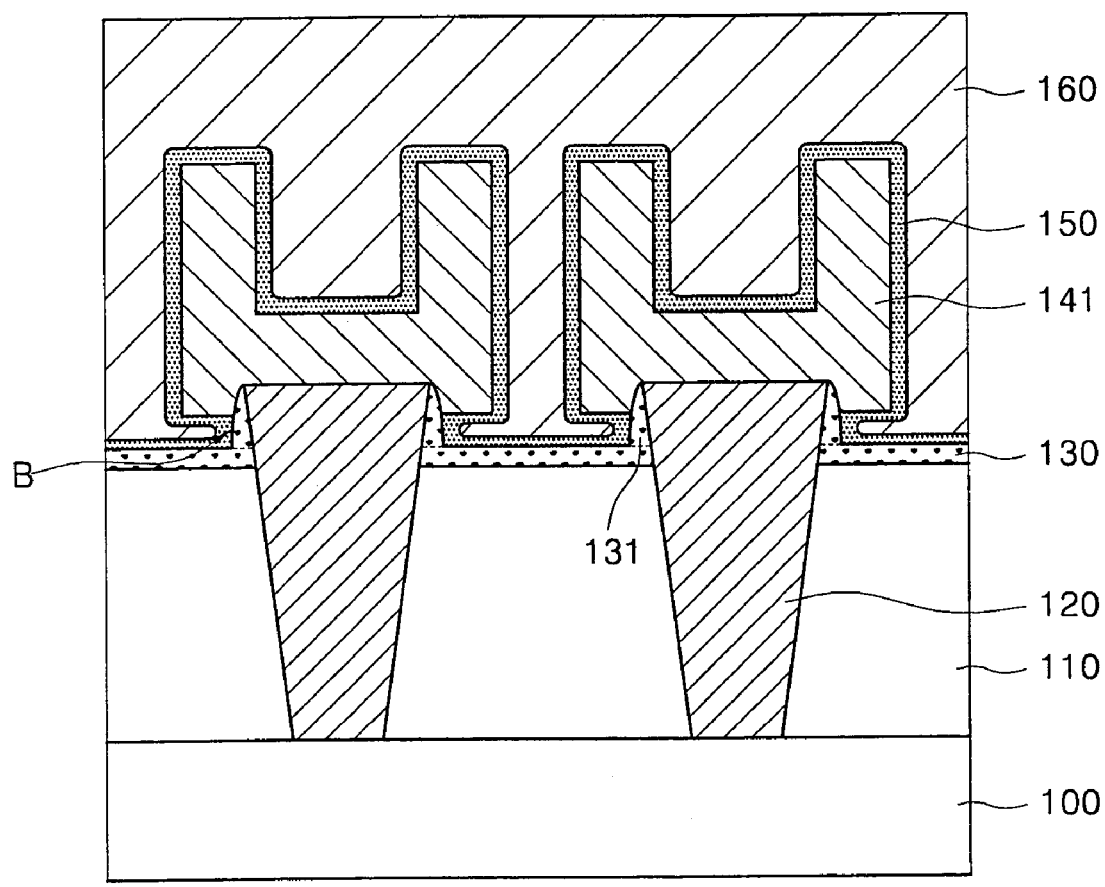

Referring to FIG. 2H, the sacrificial layer 220 and the molding pattern 211 are removed, so as to expose the charge storage electrodes 141. Thus, a space B is formed between a part of the bottom of the charge storage electrode 141, the spacer 131, and the etch stop layer 130 on the interlayer insulating layer 110.

Referring to FIG. 2I, a dielectric layer 150 and a plate electrode 160 are formed in stack on the charge storage electrodes 141. The dielectric layer 150 and the plate electrode 160 may be formed to fill the space B. Thus, the plate electrode has a larger surface area, providing a greater capacitance for the resulting capacitor.

FIGS. 3A to 3H are cross-sectional diagrams illustrating a method of fabricating a semiconductor device according to other embodiments of the invention.

Figure 3A:
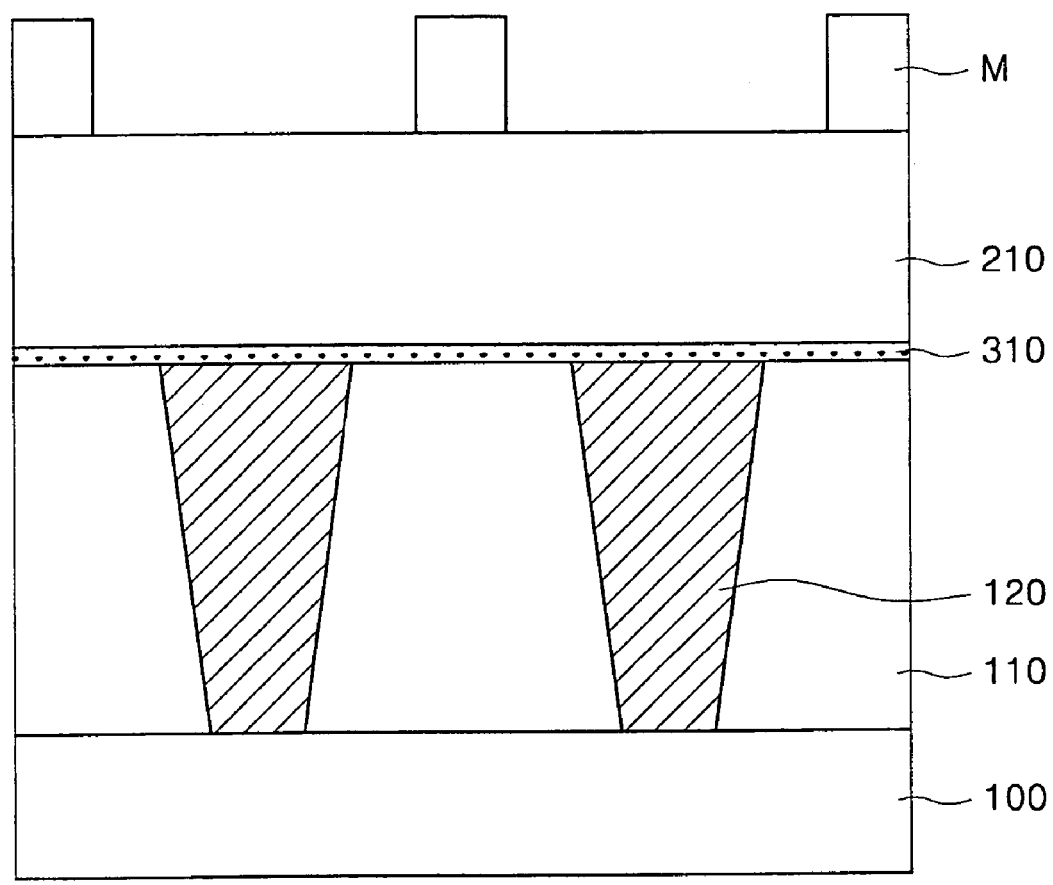
FIGS. 3A to 3H are cross-sectional diagrams illustrating a method of fabricating a semiconductor device according to other embodiments of the invention.

Referring to FIG. 3A, at least two contact plugs 120 are formed through an interlayer insulating layer 110 covering a semiconductor substrate 100 to contact the semiconductor substrate. Then, an etch stop layer 310 is formed to cover the contact plugs 120 and the interlayer insulating layer 110. The etch stop layer 310 may be formed of SiN. Then, a molding layer 210 is formed on the etch stop layer 310, and a mask pattern M is formed on the molding layer 210 to define a region for forming a charge storage electrode.

Figure 3B:
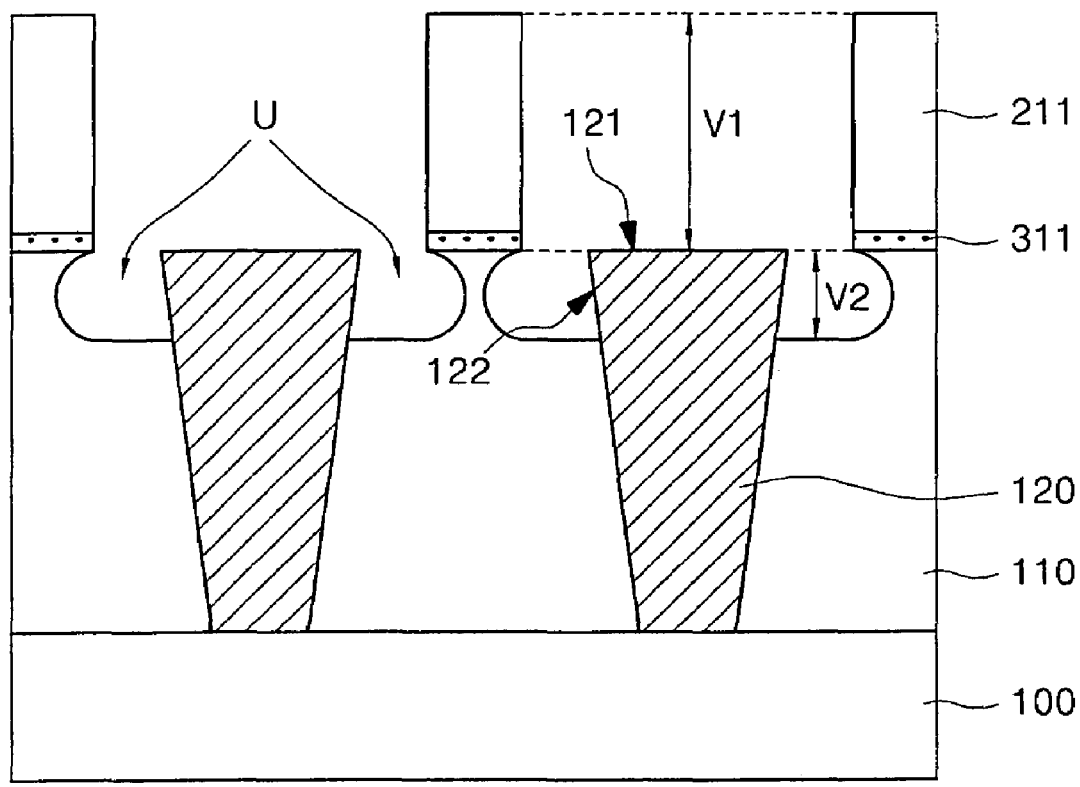

Referring to FIG. 3B, using the mask pattern M as an etch mask, the molding layer 210 and the etch stop layer 130 are etched so as to form a molding pattern 211 and an etch stop layer pattern 311, and a cleaning process is performed. Furthermore, after the molding pattern 211 and the etch stop layer pattern 311 are formed, a first opening V1 is formed to expose the upper surface of the contact plugs 120 and the interlayer insulating layer 110 around the bottom of the contact plugs. The interlayer insulating layer 110, exposed on the bottom of the first opening V1 by the cleaning process, is isotropically etched, so as to form an undercut U under the etch stop layer pattern 311. Thus, the first opening V1 is extended, so as to form a second opening V2 that exposes the upper sidewalls 122 of the contact plugs 120.

Figure 3C:
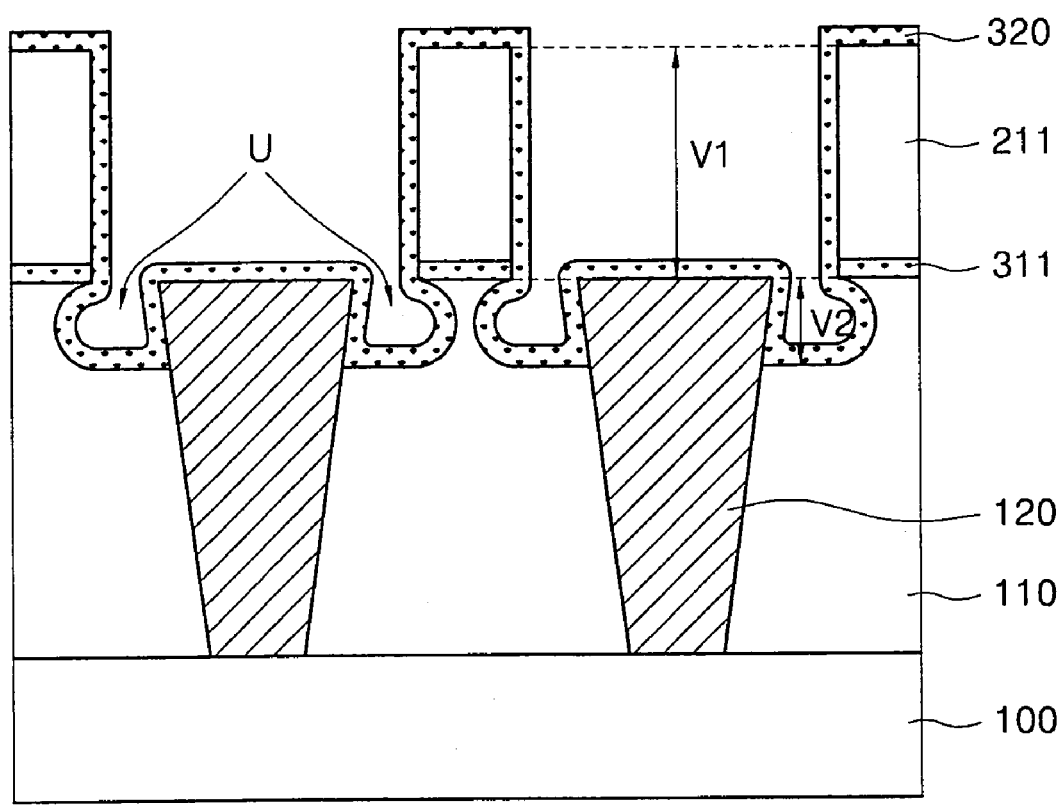

Referring to FIG. 3C, a contact prevention layer 320 is formed on the semiconductor substrate 100 having the first opening V1 and the second opening V2. The contact prevention layer 320 is preferably formed of a material having an etch selectivity with respect to the molding pattern 211 and the interlayer insulating layer 110. The contact prevention layer 320 may be formed of SiN.

Figure 3D:
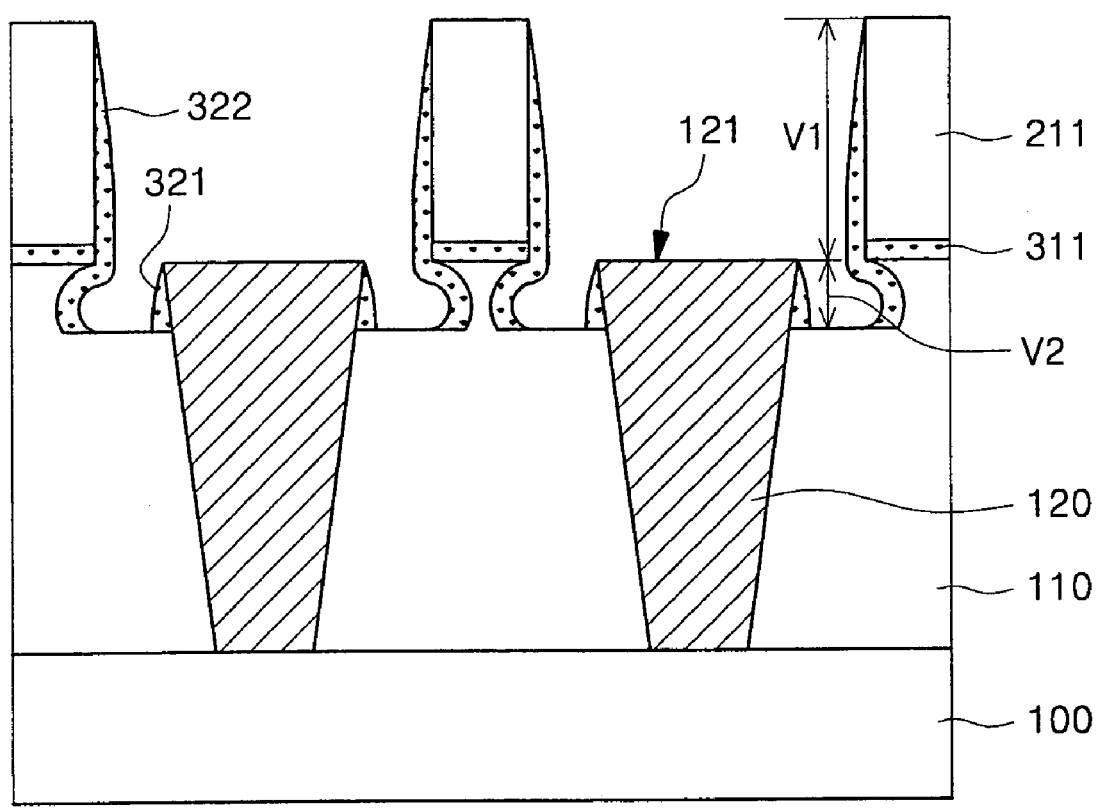

Referring to FIG. 3D, the contact prevention layer 320 is anisotropically etched. This exposes the upper surface 121 of the contact plugs 120. A portion of the contact prevention layer 320 is left on the upper sidewalls of the contact plugs 120 and the inner sidewalls of the first opening V1 and the second opening V2 to form a spacer 321 and a contact prevention pattern 322. The interlayer insulating layer 110 may be exposed between the spacer 321 and the contact prevention pattern 322.

Figure 3E:
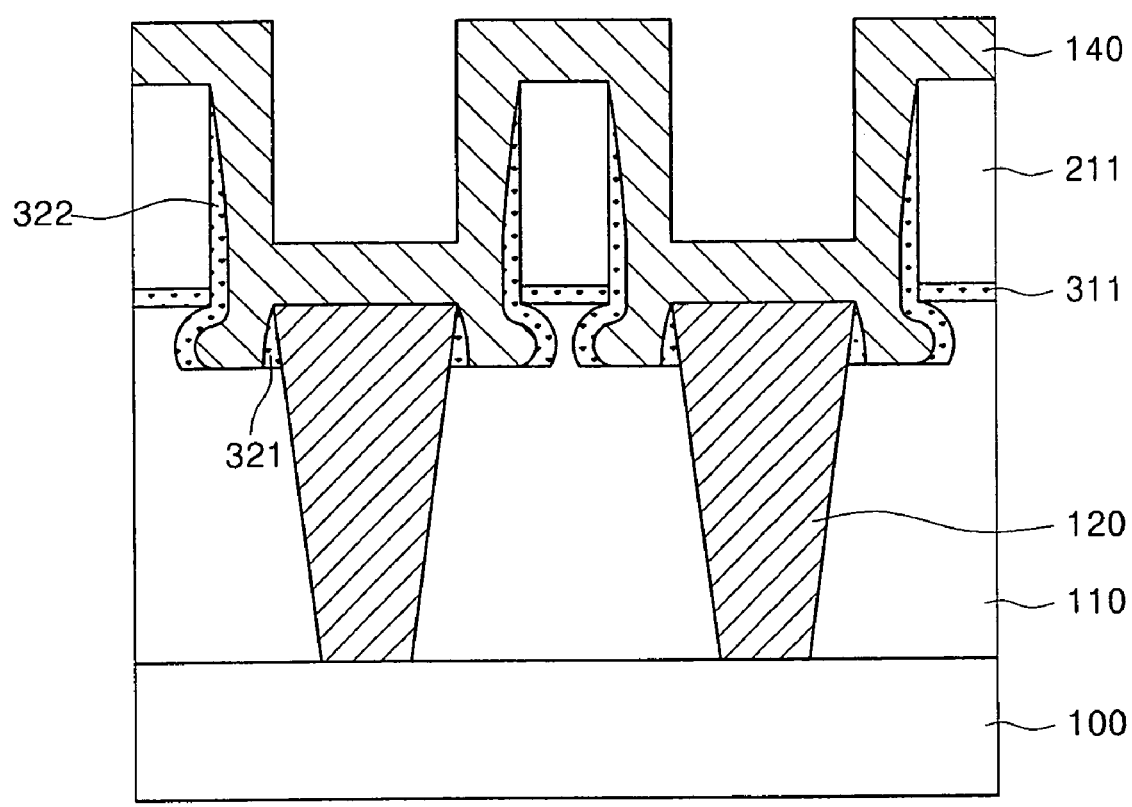

Referring to FIG. 3E, a conductive layer 140 is formed on the semiconductor substrate 100 having the spacer 321 and the contact prevention pattern 322. The contact prevention pattern 322 prevents a portion of the conductive layer 140 under the etch stop layer pattern 311 from coming into contact with another portion of the conductive layer under the etch stop layer pattern. Thus, as shown in FIG. 3B, even though an undercut U is generated during the cleaning process, adjacent charge storage electrodes may still be separated from one another.

Figure 3F:
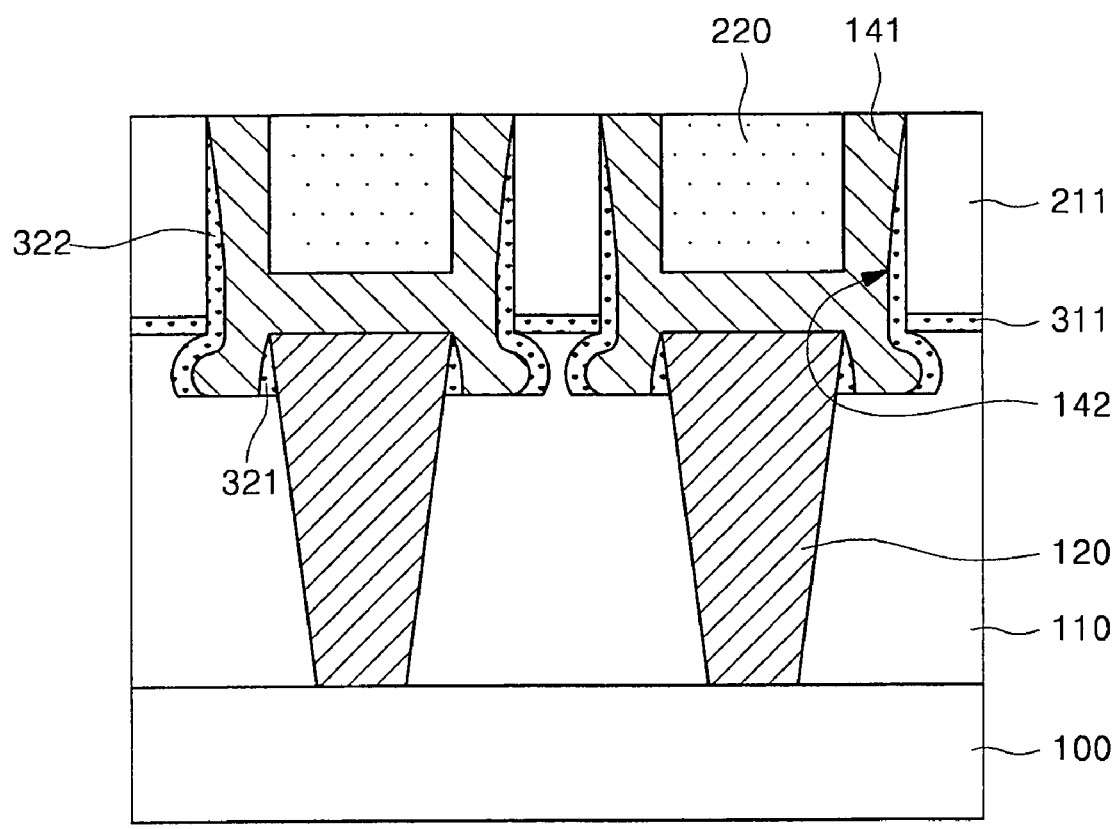

Referring to FIG. 3F, a portion of the conductive layer 140 is covered with a sacrificial layer 220, and the conductive layer 140 is removed until the upper surface of the molding pattern 211 is exposed, forming a number of charge storage electrodes 141 that are separated from one another. The charge storage electrodes 141 may cover the spacer 321. Furthermore, in accordance with the shape of the contact prevention pattern 322, the outer sidewalls 142 of the charge storage electrodes 141 may have curved shapes. Thus, a surface area of the charge storage electrode 141 may be increased, thereby resulting in an increased capacitance.

Figure 3G:
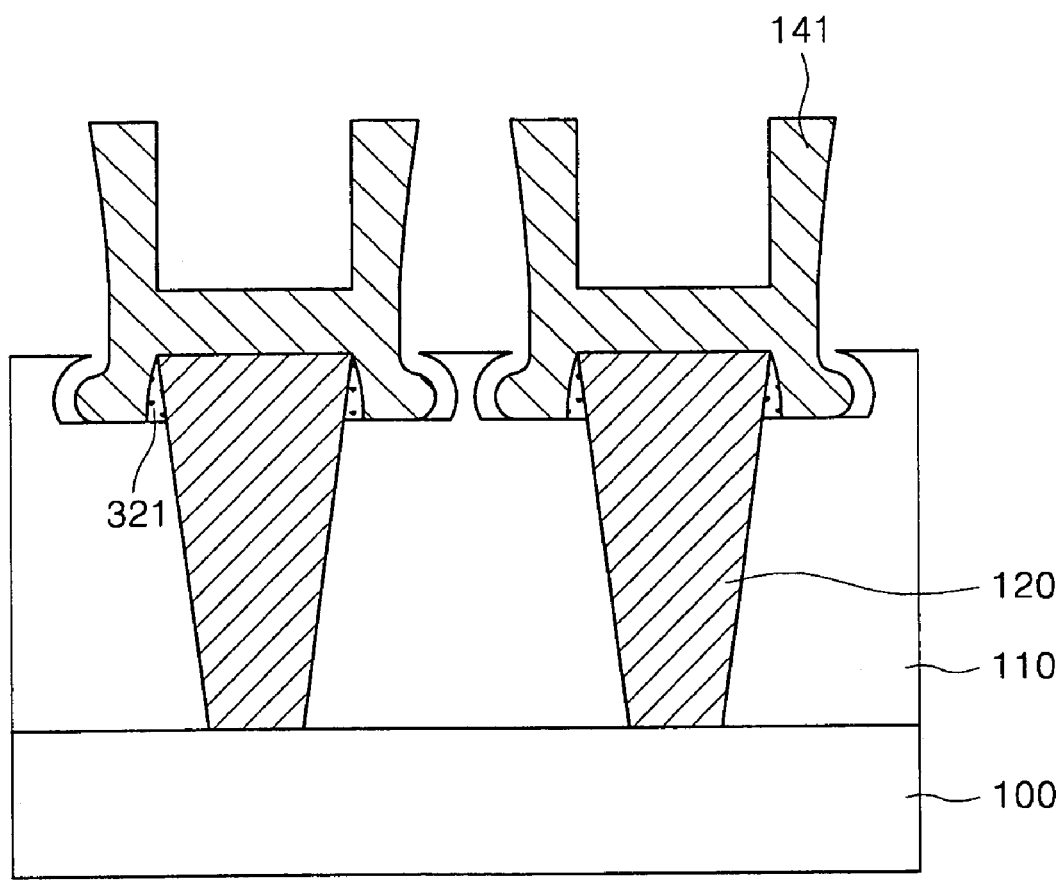

Referring to FIG. 3G, the sacrificial layer 220, the molding pattern 211, and the contact prevention pattern 322 are removed, so as to expose the charge storage electrodes 141. The sacrificial layer 220, the molding pattern 211, and the contact prevention pattern 322 may be individually removed. Alternatively, the sacrificial layer 220 and the molding pattern 211 may be concurrently removed, and the contact prevention pattern 322 may be separately removed. As described above, in the case that the contact prevention layer of the contact prevention pattern 322 is formed of SiN, a wet etch process may be performed using $H_3PO_4$, so as to remove the contact prevention pattern 322.

Figure 3H:
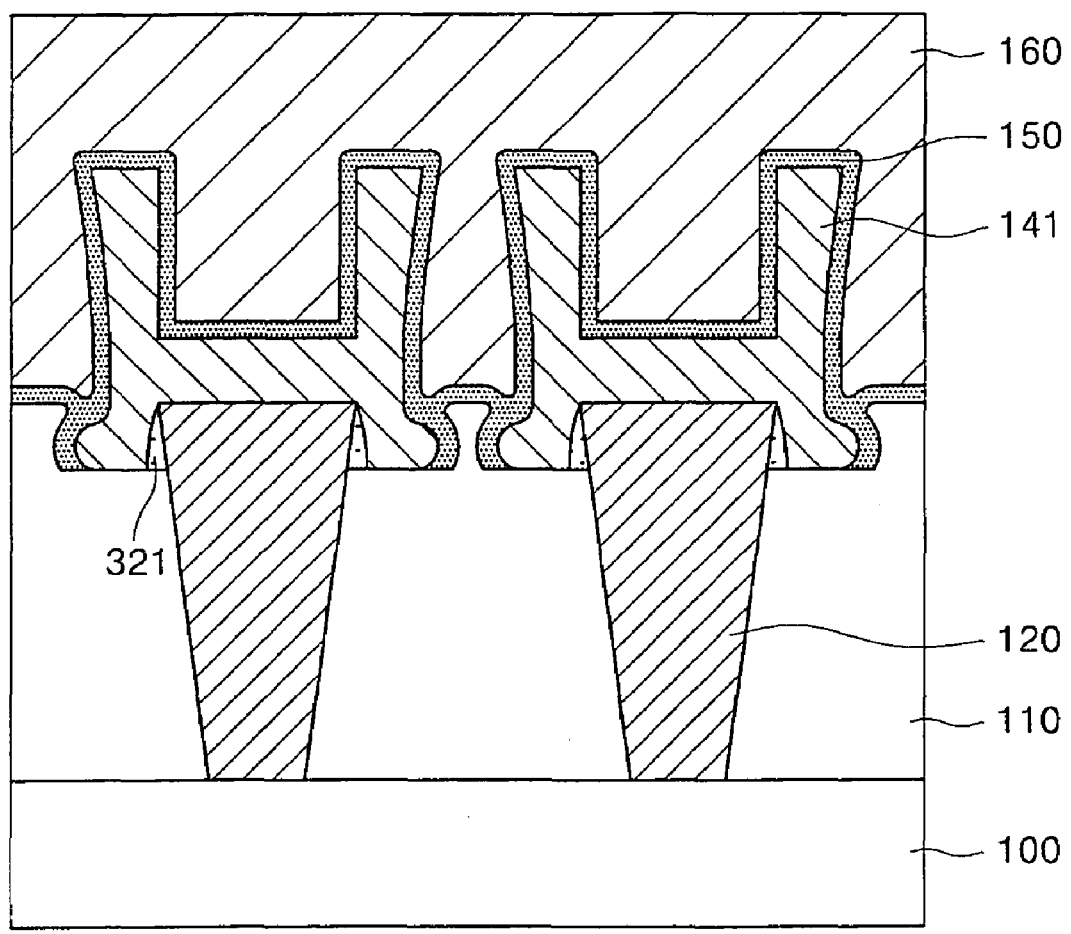

Referring to FIG. 3H, a dielectric layer 150 and a plate electrode 160 are sequentially stacked on the charge storage electrodes 141.

According to the embodiments of the invention described above, an etch stop layer is formed to cover the upper sidewalls of the contact plug and the interlayer insulating layer. Therefore, an undercut may be prevented during the cleaning process after the opening for defining a region of the charge storage electrode is formed. Thus, adjacent charge storage electrodes may be prevented from being connected through the undercut. Furthermore, an opening is formed to expose the upper sidewalls of the contact plug, and the contact prevention pattern is formed on the inner sidewalls of the opening, thereby preventing adjacent charge storage electrodes from being connected. Therefore, the deterioration of a device may be prevented and the reliability improved. Furthermore, even though mis-aligns of the mask may be generated during the formation of the molding pattern, the adjacent charge storage electrodes may be prevented from being connected. Furthermore, the charge storage electrode is formed to cover the upper sidewalls of the contact plug, thereby preventing a leaning of the high charge storage electrode.

Embodiments of the invention may be practiced in many ways. What follows are exemplary, non-limiting descriptions of some embodiments of the invention.

In accordance with some embodiments of the invention, a method of fabricating a semiconductor device includes forming an interlayer insulating layer on a semiconductor substrate, and forming at least two contact plugs that penetrate the interlayer insulating layer to connect with the semiconductor substrate. The contact plugs have an upper surface and upper sidewalls that are higher than a top surface of the interlayer insulating layer. An etch stop layer is formed to cover the contact plugs and the interlayer insulating layer. A molding layer is formed on the etch stop layer. A molding pattern having an opening is formed by selectively etching the molding layer. A bottom of the opening includes a central region for exposing the etch stop layer on upper surface of the contact plugs, and a peripheral region extending from the central region and spaced apart from the etch stop layer on the interlayer insulating layer. The upper surface of the contact plugs is exposed by etching the etch stop layer exposed on the bottom of the opening. A charge storage electrode is formed inside the opening, in contact with the contact plugs. By removing the molding pattern to expose the charge storage electrode, a space is formed between the charge storage electrode and the etch stop layer on the interlayer insulating layer.

In accordance with other embodiments of the invention a method of fabricating a semiconductor device includes forming an interlayer insulating layer on a semiconductor substrate. At least two contact plugs are formed that penetrate the interlayer insulating layer to connect with the semiconductor substrate. An etch stop layer is formed to cover the contact plugs and the interlayer insulating layer. A molding layer is formed on the etch stop layer. By selectively etching the molding layer and the etch stop layer, a first opening that penetrates the molding layer and the etch stop layer is formed. The first opening may expose an upper surface of the contact plugs and the interlayer insulating layer around the contact plugs. By partially etching the interlayer insulating layer exposed on a bottom of the first opening, a second opening is formed inside the interlayer insulating layer. The second opening may extend from the first opening and expose upper sidewalls of the contact plugs. A contact prevention layer is formed on the semiconductor substrate having the first opening and the second opening. The overall surface of the contact prevention layer is etched, to expose the upper surface of the contact plugs, and to form a contact prevention pattern covering the first opening and inner sidewalls of the second opening. A charge storage electrode is formed inside the first opening and the second opening, the charge storage electrode in contact with the upper surface of the contact plugs. The charge storage electrode is exposed by removing the molding layer and the contact prevention pattern.

Although the above specification may refer to "an", "one", "another," or "some" embodiment(s) in several locations, this does not necessarily mean that each such reference is to the same embodiment(s), or that the feature described only applies to a single embodiment.

Having described several exemplary embodiments of the invention, it should be apparent that modifications and variations of the described embodiments will be obvious to those of skill in the art that do not depart from the inventive concepts disclosed above. Consequently, the scope of the invention should not be limited to only those embodiments described above, but to all embodiments as defined and encompassed by the attached claims.

We claim:

1. A method of fabricating a semiconductor device comprising:

forming an interlayer insulating layer on a semiconductor substrate;

forming at least two contact plugs that penetrate the interlayer insulating layer and contact the semiconductor substrate, the at least two contact plugs having an upper surface and an upper sidewall that are higher than a top of the interlayer insulating layer;

covering the contact plugs and the interlayer insulating layer with an etch stop layer;

covering the etch stop layer with a molding layer;

etching the molding layer to form a molding pattern having at least two openings, a bottom of the at least two openings including a central region that exposes the etch stop layer on the upper surface of the at least two contact plugs and a peripheral region extending away from the central region and the etch stop layer on the upper sidewall;

etching the etch stop layer to expose the upper surface of the contact plugs;

forming at least two charge storage electrodes, each of the at least two charge storage electrode in contact with one of the contact plugs inside one of the at least two openings; and removing the molding pattern to expose the at least two charge storage electrodes and to form a space between the at least two charge storage electrodes and the etch stop layer on the interlayer insulating layer.

2. The method of claim 1, further comprising wet cleaning after etching the etch stop layer.

3. The method of claim 1, wherein etching the etch stop layer further comprises etching the etch stop layer to form spacers on the upper sidewalls of the at least two contact plugs.

4. The method of claim 3, further comprising, after etching the etch stop layer, removing a portion of the molding pattern by over-etch to expose a portion of the spacers.

5. The method of claim 4, wherein forming the at least two charge storage electrodes comprises covering the portion of the spacers with the at least two charge storage electrodes.

6. The method of claim 1, further comprising, after removing the molding pattern:

covering the at least two charge storage electrodes with a dielectric layer; and covering the dielectric layer with a plate electrode.

7. The method of claim 1, wherein forming the interlayer insulating layer comprises forming the interlayer insulating layer of a material selected from the group consisting of BPSG, PSG, and USG.

8. The method of claim 7, wherein covering the contact plugs and the interlayer insulating layer with the etch stop layer comprises covering the contact plugs and the interlayer insulating layer with a silicon nitride layer.

9. The method according to claim 1, wherein covering the etch stop layer with the molding layer comprises covering the etch stop layer with a material having an etch rate less than that of the interlayer insulating layer.

* * * * *